(12) United States Patent
Shi et al.

(10) Patent No.: US 11,926,890 B2
(45) Date of Patent: Mar. 12, 2024

(54) CATHODE ARC SOURCE

(71) Applicant: Nanofilm Technologies International Limited, Singapore (SG)

(72) Inventors: Xu Shi, Singapore (SG); Ming Chu Yang, Singapore (SG); Kok How Tan, Singapore (SG)

(73) Assignee: NANOFILM TECHNOLOGIES INTERNATIONAL LIMITED, Singapore (SG)

( * ) Notice: Subject to any disclaimer, the term of this patent is extended or adjusted under 35 U.S.C. 154(b) by 126 days.

(21) Appl. No.: 17/437,646

(22) PCT Filed: Mar. 13, 2020

(86) PCT No.: PCT/EP2020/056860
§ 371 (c)(1),
(2) Date: Sep. 9, 2021

(87) PCT Pub. No.: WO2020/187743
PCT Pub. Date: Sep. 24, 2020

(65) Prior Publication Data
US 2022/0145444 A1 May 12, 2022

(30) Foreign Application Priority Data

Mar. 15, 2019 (EP) .................................... 19163312
May 30, 2019 (GB) .................................... 1907666

(51) Int. Cl.
C23C 14/14 (2006.01)
C23C 14/06 (2006.01)
(Continued)

(52) U.S. Cl.
CPC ........ C23C 14/325 (2013.01); C23C 14/0605 (2013.01); C23C 14/14 (2013.01); H01J 37/32055 (2013.01); H01J 2237/332 (2013.01)

(58) Field of Classification Search
CPC ... C23C 14/20; C23C 14/325; C23C 14/0605; C23C 14/14; H01J 37/32055; H01J 37/34; H01J 37/3402; H01J 2237/332
(Continued)

(56) References Cited

U.S. PATENT DOCUMENTS 6,031,239 A 2/2000 Shi et al.
6,413,387 B1 7/2002 Shi et al.
(Continued)

FOREIGN PATENT DOCUMENTS

CN 1459516 A 12/2003
CN 201158702 Y 12/2008
(Continued)

OTHER PUBLICATIONS

Machine Translation China 108203090 Jun. 2018 (Year: 2018).*
(Continued)

Primary Examiner — Rodney G McDonald
(74) Attorney, Agent, or Firm — Sterne, Kessler, Goldstein & Fox P.L.L.C.

(57) ABSTRACT

A cathode arc source comprises: a cathode target; a first magnetic field source located above the target; a second magnetic field source located below the target; and a third magnetic field source located between the first and second magnetic field sources and having an opposite polarity to the first magnetic field source; wherein the resultant magnetic field from the first, second and third magnetic field sources has zero field strength in a direction substantially normal to the target at a position above the target. The invention also provides methods of striking a cathode target and methods of depositing coatings which can be carried out using the cathode arc source described herein.

17 Claims, 8 Drawing Sheets

(51) Int. Cl.
*C23C 14/32* (2006.01)
*H01J 37/32* (2006.01)

(58) Field of Classification Search
USPC ................................. 204/192.38, 298.41
See application file for complete search history.

(56) References Cited

U.S. PATENT DOCUMENTS

| | | | |
|---|---|---|---|
| 6,645,354 | B1 | 11/2003 | Gorokhovsky |
| 6,761,805 | B1 * | 7/2004 | Shi ..................... C23C 14/0605 204/298.12 |
| 7,381,311 | B2 | 6/2008 | Aksenov et al. |
| 2004/0055538 | A1 | 3/2004 | Gorokhovsky |
| 2004/0137725 | A1 | 7/2004 | Cheah et al. |
| 2005/0224344 | A1 | 10/2005 | Iwasaki et al. |
| 2006/0175190 | A1 | 8/2006 | Schuetze et al. |
| 2007/0029188 | A1 | 2/2007 | Gorokhovsky |
| 2007/0187229 | A1 | 8/2007 | Aksenov et al. |
| 2010/0190036 | A1 | 7/2010 | Komvopoulos et al. |
| 2011/0100800 | A1 | 5/2011 | Gorokhovsky |
| 2011/0140367 | A1 | 6/2011 | Shi |
| 2011/0177460 | A1 | 7/2011 | Shi |
| 2011/0186420 | A1 | 8/2011 | Shi |
| 2013/0180845 | A1 | 7/2013 | Shi et al. |
| 2013/0214684 | A1 | 8/2013 | Vasyliev et al. |
| 2014/0332370 | A1 | 11/2014 | Mojmir et al. |
| 2021/0348261 | A1 | 11/2021 | Shi et al. |
| 2022/0002861 | A1 | 1/2022 | Shi et al. |
| 2022/0033975 | A1 | 2/2022 | Shi et al. |

FOREIGN PATENT DOCUMENTS

| | | |
|---|---|---|
| CN | 101363114 A | 2/2009 |
| CN | 102936717 A | 2/2013 |
| CN | 206337307 U | 7/2017 |
| CN | 108203090 A | 6/2018 |
| CN | 108456844 A | 8/2018 |
| EP | 0495447 A1 | 7/1992 |
| GB | 2410255 A | 7/2005 |
| JP | 2007056347 A | 3/2007 |
| JP | 2007-305336 A | 11/2007 |
| WO | WO-9626531 A2 | 8/1996 |
| WO | WO-9803988 A2 | 1/1998 |
| WO | WO-9922395 A2 | 5/1999 |

OTHER PUBLICATIONS

Machine Translation China 108456844 Aug. 2018 (Year: 2018).*
Kuhn, M., et al., "Deposition of carbon films by a filtered cathodic arc," Diamond and Related Materials 2:1350-1354, Elsevier, Netherlands (1993).
Neuville, S., "New application perspective for tetrahedral amorphous carbon coatings," QScience Connect 2014(1):8, 27 pages, Hamad Bin Khalifa University Press, Qatar (2014).
Co-pending Application, U.S. Appl. No. 17/414,843, inventors Shi, X., et al., filed Dec. 17, 2019 (Not yet Published).
Co-pending Application, U.S. Appl. No. 17/437,648, inventor Shi, X., filed Mar. 13, 2020 (Not yet Published).

* cited by examiner

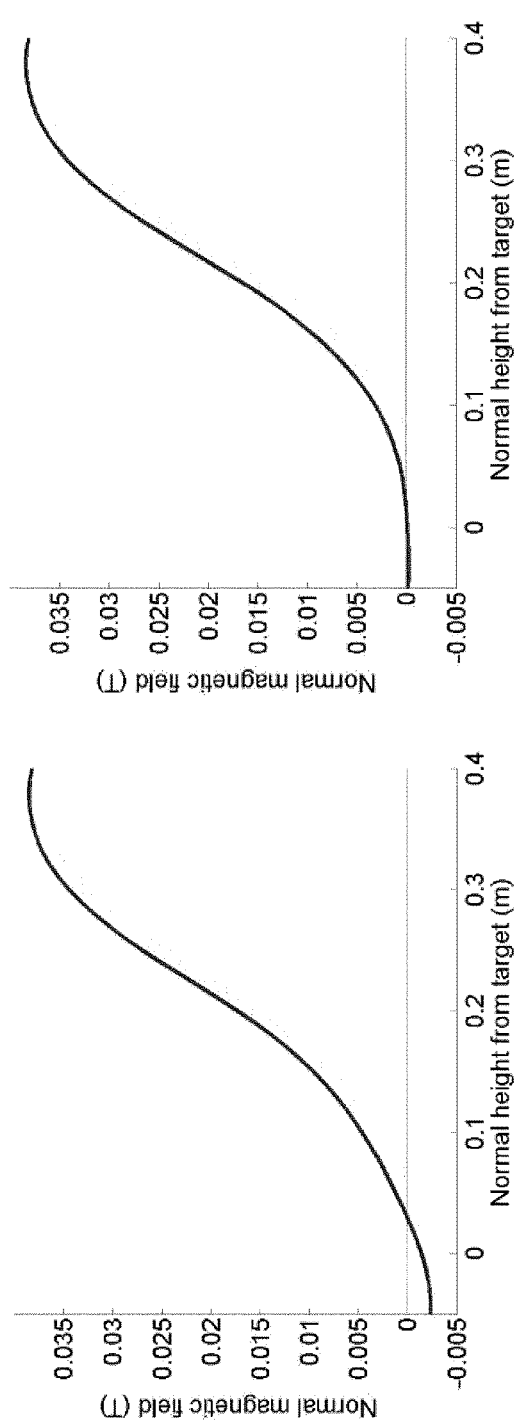
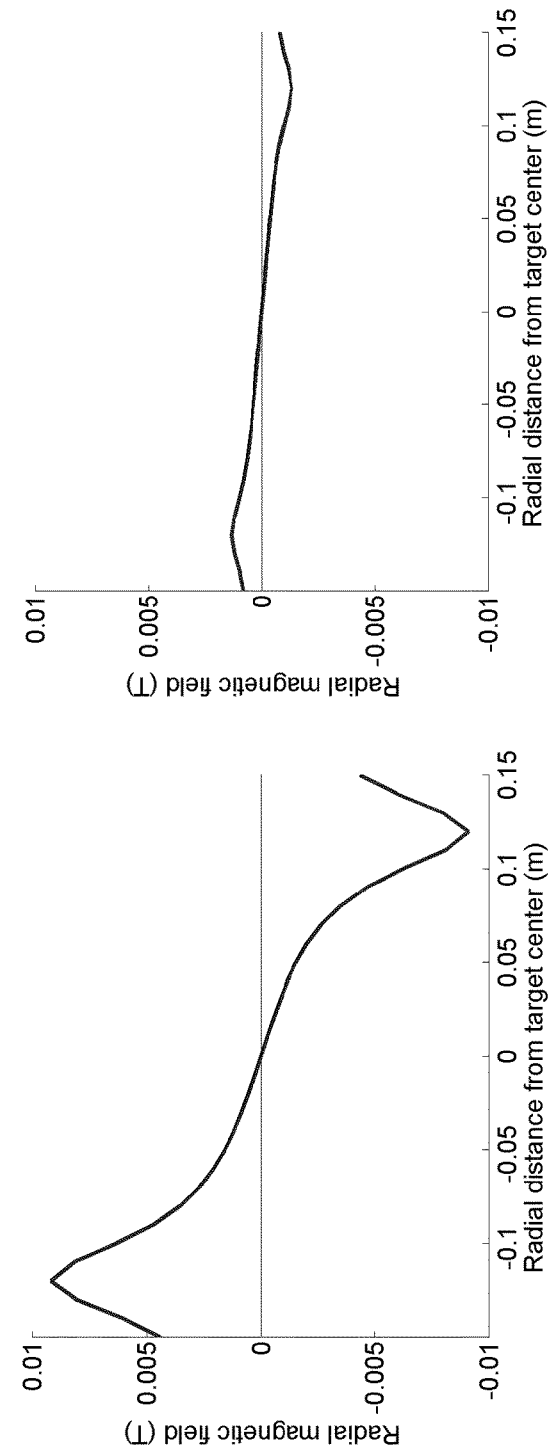

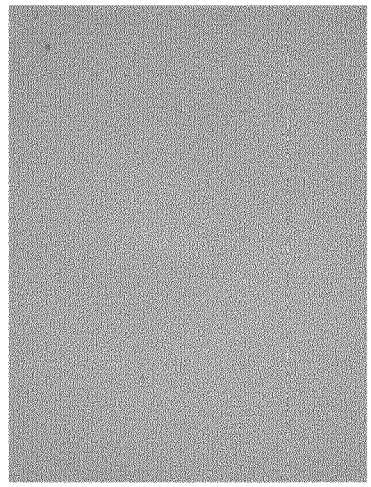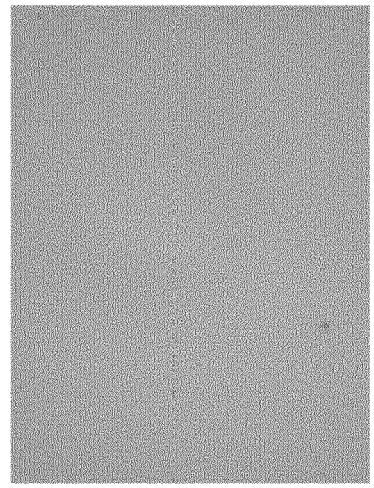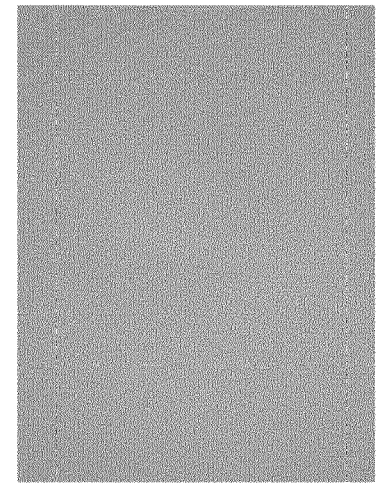
A　　　　　　　　B　　　　　　　　C
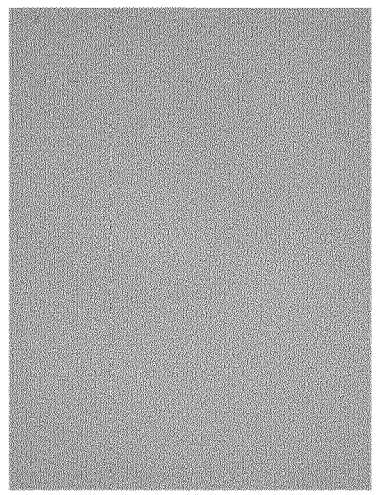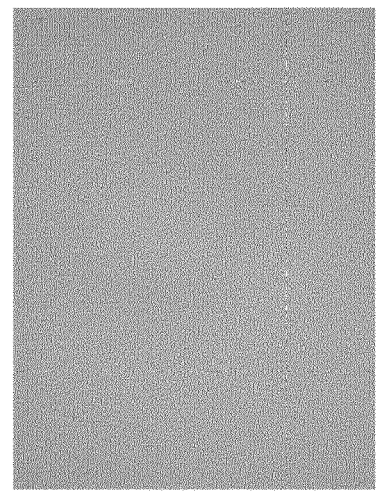
D　　　　　　　　E
Figure 7

CATHODE ARC SOURCE

INTRODUCTION

This present invention relates to an improved cathode arc source, in particular an improved filtered cathode vacuum arc (FCVA) source. The improved cathode arc sources allow for a wider range of materials to be used in the target, compared to conventional cathode arc sources, and thus allows a wider range of materials to be used as coatings in cathode arc source deposition/coating processes.

BACKGROUND TO THE INVENTION

Cathode arc sources are used, inter alia, to produce hard, dense, thin coatings on substrates at low temperatures with good adhesion to the substrate. The coatings may be carbon-based (e.g. tetrahedral amorphous carbon coatings) or to a very limited extent metallic. When the coating is a carbon-based coating, graphite is used as a target. When the coating is metallic, the bulk metal or alloy can be used as the target.

One problem in prior art cathode arc sources is that their intense arc spots produce large quantities of macroparticles that contaminate the plasma generated from the target and, in turn, the deposited coatings. The problem of reducing the number of macroparticles in the coatings is conventionally addressed by provision of means for filtering the macroparticles from the plasma beam between the target and the substrate to be coated.

Known commercial apparatus incorporate a 45° angle bend to filter macroparticles from the beam. In addition, WO 96/026531 describes as an apparatus with a double bend filter duct for the same purpose. While this latter apparatus is particularly efficient, it is desirable to provide alternative and/or additional means for reducing macroparticles in the deposited coatings.

WO 98/03988 describes a cathode arc source comprising a graphite target and means for generating a magnetic field in a direction substantially normal to the target which has zero field strength. The magnetic field is typically generated by two magnetic field sources of opposing directions, one located above the target and the other located below the target. The apparatus in WO 98/03988 can stabilize the arc and reduce the depositing of macroparticles on the substrate to be coated.

However, whilst the apparatus described in WO 98/03988 works well with graphite targets for forming carbon coatings, the apparatus is less suitable for metallic targets.

A related problem is that macroparticle generation using cathode arc technology can in theory be reduced by using lower arc currents. In practice the arc extinguishes, however, when the current is reduced below its minimum stable current (or chopping current). This is problematic for metallic targets as the cathode arc source is not particularly stable and once ignited will not stay lit for a prolonged period of time. Therefore, in order to improve the stability of the arc spot, higher arc currents are required. Whereas arc currents as low as 20 A to 30 A can be used on graphite targets, conventionally currents in excess of 100 A have been required for metallic targets. These higher arc currents are not compatible with all metal targets (such as copper and nickel targets). Therefore, to date, the use of cathode arc sources in the production of metallic coatings has been limited to the production of chromium, aluminium and titanium coatings, and even such targets can only be used to a limited extent and/or with constant supervisions of the apparatus. Hence, long term use of metallic targets has not been possible, nor has development past laboratory scale apparatus using metallic targets.

Whilst other physical vapour deposition coating methods are known (e.g. sputtering), not all of these methods are suitable for use with all types of metals. For example, nickel coatings cannot satisfactorily be produced using sputtering techniques.

EP 0495447 A1 (Kabushiki Kaisha Kobe Seiko Sho) describes a method of controlling an arc spot in vacuum arc vapor deposition and an evaporation source. U.S. Pat. No. 7,381,311 B2 (Aksenov et al.) describes a furthered cathodic-arc plasma source. In both of these sources, magnetic fields are used to direct ions ejected from the target to the substrate. US 2004/0137725 describes metal coatings formed using FCVA apparatuses and CN 108456844 describes forming a Ni/Cu coating using an FCVA process.

Therefore, the exists the need for improved cathode arc source apparatuses, particularly those that are able to make use of metallic targets to produce metallic coatings on substrates.

The Invention

By modifying the apparatus in WO 96/026531, it has been found that stable arc spots can be achieved using lower arc currents and hence the modified apparatus is suitable for use with a wider range of targets, including in particular metallic and alloy targets. This means that metals such as nickel, tungsten and copper, and others, can now, for the first time, be deposited by FCVA methods, and metallic targets generally can now be used on an industrial scale.

Accordingly, the invention provides a cathode arc source comprising:
- a station for a cathode target;
- a first magnetic field source located above the target station;
- a second magnetic field source located below the target station; and
- a third magnetic field source located between the first and second magnetic field sources and having an opposite polarity to the first magnetic field source;
- wherein the resultant magnetic field from the first, second and third magnetic field sources has zero field strength in a direction substantially normal to the target at a position above the target station.

In use of the apparatus a target is located at the target station. Known apparatus provided a point of zero normal field above the target (and inside the arc chamber). The addition of a third magnetic field source according to the invention reduces the radial strength of the resultant magnetic field from all three sources, compared with the known apparatus, whilst maintaining a region above the target where the field strength in a direction normal to the target is zero.

It has also surprisingly been found that the addition of the third magnetic field source increases the size of the region located above the target where the strength of the magnetic field is low in a direction substantially normal to the target (see FIGS. 4A to 5B and the Examples described herein).

The term "normal" as used herein refers to a direction which is orthogonal to the surface of the target. The term "radial" as used herein refers to a direction in the plane of the surface of the target.

With reference to the cathode target, stronger lateral fields are found to promote spot motion. With each new emission centre created with the apparent spot motion, more plasma is generated at the cathode. The plasma improves the conductivity at the target and thereby reduces the current required to maintain the arc. Inversely, stronger normal fields promote plasma transport, destabilizing the arc as more energy is needed to compensate for the reduced plasma density.

The addition of a third magnetic field source increases the freedom of handling the resultant magnetic field. Since the target surface is positioned between the second and third magnetic field sources, the third magnetic field source generates an opposing radial field to the second magnetic field source. Therefore, changing the field strength generated by the third magnetic field source can achieve fields ranging from solely normal fields to exclusively lateral fields and effectively altering the ratio of normal and lateral field at or just above the target surface.

Accordingly, the third magnetic field source can be used to generate an area or region with zero field strength in a direction normal across a larger portion of the target surface. This stabilises the arc, as described above, and hence allows lower arc currents to be used.

The cathode arc source generates positive ions (e.g. positive carbon or metal ions) from a cathode target, said ions being emitted in a direction substantially normal to a front surface of the cathode target. The cathode arc source also comprises a vacuum chamber and the resultant magnetic field (from the first, second and third magnetic field sources) has a direction substantially normal to the front surface of the target and zero field strength at a position above the target and inside the vacuum chamber. The resultant magnetic field inside the vacuum chamber includes a point at which the field strength is zero in a direction substantially normal to the front surface of the cathode target.

The target can be any material used for cathode arc sources. In particular it is or comprises a metal or an alloy. Suitable metals for the metal and alloy targets include aluminium, copper, nickel, tungsten, chromium, zinc, titanium and silver, and alloys of two or more, or three or more thereof. Carbon-containing targets can also be used with the invention, though in general the third magnetic field source is not needed to obtain stable FCVA deposition from carbon targets.

In use, the cathode arc source of the invention produces a beam of positive ions having reduced numbers of macroparticles compared to cathode arc sources without the first, second and third magnetic field sources described herein. Filtering of the plasma beam further to reduce macroparticles is therefore an optional, though preferred, feature of the invention. The source of the invention is therefore suitable for use with or without filtering apparatus. Examples of apparatus incorporating the invention include, in particular, a single bend or a double bend filter duct (such as one as described in WO 96/126531). Further, in use of the arc source the arc spot can be maintained using lower arc current, enabling operation of the cathode arc source with targets previously regarded as unsuitable for such deposition methods, especially various metals and alloys.

The cathode arc source may comprise first, second and third magnetic field sources wherein:
(1) at a front surface of the target, the resultant field direction substantially normal to the front surface is towards the front surface;
(2) magnetic field strength in the direction substantially normal to the front surface decreases with increasing distance from the target to a point or region of zero normal field strength; and
(3) from the point or region of zero normal field strength, with increasing distance from the target, field direction is away from the front surface of the target.

In this arrangement, positive ions emitted from a front surface of the target pass first through a magnetic field whose direction is substantially opposite to the direction of the positive ions, secondly through a point or region in which the magnetic field strength in that direction is zero and thirdly through a magnetic field whose direction is substantially the same as that of the positive ions. The latter field conveniently can be used to steer the positive ions through filtering apparatus (when present, especially a double bend filter) and towards a substrate to be coated.

Herein, a point or region of zero field strength in a direction substantially normal to the front surface of the target is also referred to as a null point or region.

The cathode arc source may comprise, in addition to the first, second and third magnetic field sources, one or more of the following: a cathode target (e.g. a graphite, metal or alloy target), an anode, an arc power supply, a substrate and means for generating positive ions in an arc from the cathode.

In use of the cathode arc source, an arc is struck at a target while the first, second and third magnetic field sources are in operation.

The desired magnetic field is conveniently resultant from three separate magnetic field sources. In preferred apparatus of the invention, the strength of one or more or each magnetic field source can be selected or adjusted such that overlap of the three fields produce a null point through which positive ions pass en route to the substrate. As described elsewhere the null point can be created with lower radial field strength than hitherto and with greater size than hitherto.

Accordingly, the cathode arc source may comprise means for varying the strengths of one or more (e.g. two or more or even all three) of the magnetic field sources so as to vary the position of zero normal field strength. Such an arrangement is convenient for adjustment of the distance between the front surface of the target and the null point. Particularly conveniently, especially for apparatus used industrially, the first and second fields are fixed and null point parameters are adjusted by varying just the third field.

In addition, one or more of the magnetic field sources may be moveably mounted on the cathode arc source so that the distances between the magnetic field sources and the target can be varied, along an axis parallel to a direction normal to the target surface. Movement of the magnetic field sources can also be used to vary the position of the null point or region.

Typically, the magnetic field strengths are selected to produce a null region at a distance of up to 10 cm above the surface of the target (in a direction normal to the surface of the target). Preferably, the null region extends above the target at a distance of up to 8 cm, typically up to 6 cm, for example up to 5 cm, preferably up to 4 cm above the surface of the target.

The magnetic field sources are typically magnetic field generating coils or permanent magnets. When the magnetic field source is a permanent magnet, the magnet may be selected from ferrite magnets, alnico magnets, neodymium magnets, cobalt magnets and mixtures thereof.

The first magnetic field source (e.g. coil/magnet) is located above the target, and in use is between the target and the substrate. Such a magnetic field coil is conventionally found in filtered cathode arc sources as it provides a magnetic field to assist in steering plasma produced from the target through filtering apparatus, that may for example comprise a single or a double bend and other filtering structures such as baffles, and towards the substrate. The field generated by the coil, substantially normal to the cathode target, typically has its direction away from the target and towards the substrate.

The second magnetic field source (e.g. coil/magnet) is located below the target, that is to say the other side of the target from the substrate. This second source typically generates a magnetic field substantially co-axial with but in a direction opposite from that generated by the first source. The effect is that the field produced by the second source partially counterbalances the field produced by the first source such that, by adjustment of the relative field strengths (in combination with the third field), at a point above the target the normal field has a null point. As mentioned above, the second magnetic field source may be moveable in a direction normal to the surface of the target. As the second magnetic field source is located below the target surface it may be movable in an upward and downward position to move the magnetic field source closer to or further away from the target surface respectively. For example, the second magnetic field source may be moveable between distances of from 0 cm to 15 cm beneath the target surface, such as from 1 cm to 12 cm beneath the target surface, preferably from 4 cm to 9 cm beneath the target surface.

The third magnetic field source (e.g. coil/magnet) is located in between the first and second magnetic field sources. The third magnetic field source is typically located above the target but below the first magnetic field source. The third magnetic field source typically generated a magnetic field substantially co-axial to the fields generated by the first and second sources. The third magnetic field source generates a magnetic field having an opposite polarity to the first magnetic field source, but typically with the same polarity to the second magnetic field source. The effect is that the field produced by the third source assists the second source in counterbalancing the field produced by the first source (e.g. coil) such that, by adjustment of all relative field strengths, at a point above the target the normal field has a null point. In addition, around the null point the third source reduces the strength of the magnetic field radial to the target (i.e. in a direction substantially lateral or parallel to the front surface of the target). This has been found to create a more stable arc and expand the potential target materials.

Sufficient control of the resultant magnetic field may be achieved by varying the strength of the first and third magnetic field sources. Accordingly, the first and third magnetic field sources may be (variable) magnetic field generating coils while the second magnetic field source may be a permanent magnet. The use of a permanent magnet as opposed to a coil as the second magnetic field source reduces the electrical consumption of the apparatus.

Where the second magnetic field source is a permanent magnet, the resultant magnetic field can be altered by configuring the magnet to be movable in a direction which is normal to the target as described above.

The target typically has a diameter of from 5 cm to 15 cm, preferably from 7 cm to 12 cm, for example approximately 9 cm. Other sizes may be useful according to apparatus design and internal dimensions.

When the magnetic field sources are coils, the coils may be wrapped around the outside of the vacuum chamber of the cathode arc source to provide a magnetic field within the vacuum chamber.

As the current in the respective coils is varied so the null region, that is to say the point of zero field in a direction substantially normal to the front surface of the target, moves further away from or further towards the surface of the target. Despite this specific observation, the invention is for use with conventional arc power supplies and is not limited to particular field strengths but applies generally to cathode arc sources having crossed or reversed fields or otherwise providing a magnetic field with a null point between target and substrate.

It is further observed that the strength of the resultant magnetic field, produced by variation in strength of the counterbalancing fields, affects both arc behaviour and deposition rate. As the null point approaches closer to the target, the arc becomes more intense and is located closer to the target, a strong blue plasma is seen and there is a decrease in the deposition rate. As the null point moves far away from the target, the strength of the magnetic field at the target surface increases and sustaining the arc and striking the arc become problematic. There is also seen a decrease in deposition rate.

The null point is therefore conveniently chosen so as to be at an intermediate position, producing an arc having a diffuse arc flame and reduced arc spot intensity. For different arc source set-ups, finding suitable operating parameters may take some trial and error or calibration.

While arc current is flowing, a "hump", being an area concentrated in positive ions, forms above the target surface. Most positive ions are accelerated back towards the target surface, which is at a negative potential, typically of about −30 volts, impinging upon the target surface with high energy and perpetuating the arc. Current flows as atoms on the surface of the target are disassociated into ions and electrons—which flow to the anode which is grounded and therefore at zero volts. With an arc current of about 100 A the plasma current, i.e. the positive ions that form the plasma beam may be about 1 A. Thus, the current that goes to forming the plasma beam of positive ions is a very low proportion of the total arc current. With the third field of the invention operation at lower arc current is possible.

Alteration in the strength of the net magnetic field(s) produces corresponding variation in the location of the null point. If the null point is too close to the target surface then more electrons flow directly from the cathode to the anode at a position level with the null point. Therefore, there is much less plasma output. If the null point is chosen correctly then a column of plasma is produced giving good rates of deposition of virtually macro particle-free coatings.

As mentioned, cathode arc source typically comprises a vacuum chamber in which a cathode, an anode, and a striker are located. The anode is typically formed by the inner wall. There may also be provided an insulating shroud which surrounds the target to prevent arcing between the sides of the target and the anode. The anode and cathode are connected to a power supply. The striker is typically rotatably mounted on a wall of the vacuum chamber and is adapted to rotate towards and contact the cathode target to achieve ignition of the cathode arc.

In an embodiment of the invention, an arc source comprises a cathode located substantially centrally with a vacuum chamber. An inner surface of the chamber is grounded as an anode which thus surrounds the cathode and extends away from the cathode along the inner wall of the chamber. A target is in electrical contact with the cathode and, to prevent arcing between the cathode (rather than the target) and anode, an electrically insulating shroud surrounds the cathode. It is preferred that distances from the outer edges of the target to the anode are substantially the same all the way round the target—for example, this is achieved by provision of a substantially circular target, centrally positioned within a cylindrical anode. In addition, the edge or edges of the target are optionally shrouded so that an arc is formed only between the anode and a front surface of the target.

To prevent any overheating damaging the equipment, cooling is typically provided by a water cooled jacket around the anode and in which inlet of cold water occurs approximately adjacent to the null point so as to provide maximum cooling where the anode is most heated. Water flows into the cooling jacket approximately level with the null point and flows up an inner spiral, subsequently flowing down an outer portion of the jacket and up an inner spiral until it exits via an exit pipe. Water cooled anodes are known in the art, though these anodes typically have diameters similar to the target diameter.

Current in magnet field coils above and/or below the target can be adjusted so that both the null point and also the water inlet are approximately the same distance above the target surface.

The plasma beams produced by the cathode arc sources of the invention can subsequently be filtered using conventional single or double bend ducts. Magnetic steering of the plasma beam is achieved because the plasma beam follows the field lines of the magnetic field as is well known in the art (see, for example, WO 96/026531).

The invention also provides a method of striking an arc at a cathode target, typically in apparatus of the invention, comprising:
  (i) generating:
    (a) a first magnetic field having a first field direction; and
    (b) a second magnetic field having a second field; and
    (c) a third magnetic field having a third field direction substantially parallel to the second field direction;
      so as to generate a magnetic field that is resultant from the first, second and third magnetic fields; and
  (ii) striking the arc in the resultant field.

The second magnetic field may be in an opposite direction to that of the first magnetic field.

The first and second magnetic fields can be generated from magnetic field sources (e.g. coils) located, respectively, above and below the target, whilst the third magnetic field may be generated from a magnetic field source (e.g. a coil) in between the first and second magnetic field sources as described herein. The first coil optionally forms part of means for filtering macro particles from plasma produced by the arc by steering the plasma through a single or double bend duct. As described above, the resultant field includes a null point above the target at which point field strength normal to the target is zero, and variation in the coil currents varies the distance of the null point from the target.

The plasma beams produced by the cathode arc sources of the invention can be used for applying coatings or films to substrates. Accordingly, the invention also provides a method of depositing a coating on a substance, the method comprising:
  (a) striking an arc at a cathode target according to the methods described herein, in order to ionise the cathode material; and
  (b) directing the ionised cathode material onto the substrate to form a coating on the substrate.

As discussed above, the use of a third magnetic field source lowers the arc current required to generate a stable arc and thereby allows a greater range of materials to be coated using FCVA.

The arc source of the invention has enabled deposition of metallic films onto substrates using CVA processes. Accordingly, the invention also provides coating methods, and in particular provides a method of depositing a coating on a substrate, comprising generating positive ions from a target in a cathode vacuum arc source, and depositing the ions onto the substrate, wherein the target is a metal.

By operating these methods of the invention it is now possible to carry out CVA, especially FCVA, deposition using metallic targets made of metals and/or alloys in general and on an industrial scale, meaning stable and long term operation and sustained production of positive ions without the need for repeated restriking of the arc.

Particular of these methods of the invention provide such methods in general in which the target is not aluminium, chromium or titanium. In such embodiments of the invention providing long term, stable operation, for example maintenance of the arc without restriking for at least 5 minutes, preferably at least 10 minutes, more preferably at least 20 minutes the target can be metallic in general. For the avoidance of doubt, for these embodiments of the invention the target is not carbon either. In a specific example below, copper was deposited by FCVA onto a polymer substrate and found to be conductive. In a further specific example below nickel was deposited by FCVA and found to be magnetic.

Methods of the invention preferably are CVA, especially FCVA, methods. Methods of these embodiments are preferably carried our using the cathode arc source of the invention. Preferred methods separately may comprise using a target selected from metal and/or alloy targets, e.g. of aluminium, copper, nickel, tungsten, chromium, zinc, titanium and/or silver, and alloys of two or more, or three or more thereof. Especially preferred target materials produce coatings that are metallic and etchable, for example copper and/or nickel. Methods of the invention also comprise depositing at least a seed layer using a first metallic target by CVA, especially FCVA, and at least a further layer, using another metallic target, of a metal different from the first, again by CVA, especially FCVA. In a specific example described below, a nickel seed layer was deposited onto a polymer substrate and a copper layer deposited on top of that.

The stable arcs now obtainable from metallic targets enable further advantageous uses and applications and extension of the invention. Production of FVCA-based reactive coatings is now also possible.

Accordingly, the invention still further provides a method of depositing a coating on a substrate, comprising generating positive ions from a target in a cathode vacuum arc source, and depositing the ions onto the substrate, wherein the target is metallic and the method further comprises introducing gas into the deposition chamber so as to yield a reactive coating comprising a compound of the metal.

Hence, the invention provides methods of making CVA and especially FCVA reactive coatings using gas in the chamber and a metal or alloy target. Suitably, the methods comprise introducing the gas at or near the substrate. CVA deposition, especially FCVA deposition, may take place within a nitrogen, oxygen, methane or ethyne environment, present e.g. as $N_2$, $C_2H_2$, $CH_4$, $O_2$ etc, so that the coating may also comprise gaseous elements such as nitrogen, oxygen, carbon or hydrogen. The resulting coatings hence may be or comprise metal oxide, metal nitride and/or metal carbide—now obtainable using CVA, especially FCVA processes.

Other optional and preferred features of the source and other methods of the invention apply to production of such coatings and reactive coatings.

The invention accordingly also provides products obtained from and obtainable from the methods. The invention provides a substrate coated with a metallic coating, wherein the coating has been deposited by a CVA, especially a FCVA, process. Preferably the metal is other than aluminium, chromium or titanium, as some deposition by FCVA was hitherto possible, though to a limited extent only, with those targets. Also preferably the coating is or comprises copper, nickel, tungsten, zinc and/or silver, and alloys of two or more, or three or more of: aluminium, copper, nickel, tungsten, chromium, zinc, titanium and/or silver. In preferred examples, the metal or alloy is etchable. More preferably the metal is or comprises copper. One example described below comprises a layer of copper on polymer, deposited by FCVA. This is of use in electronics applications as copper is etchable. Also more preferably the metal is or comprises nickel. This too is of use in electronics applications as Nickel copper is etchable.

Still further provided by the invention are substrates coated with a first layer of metal or alloy by a CVA, especially a FCVA, process, and a second layer of metal or alloy, different from the first, deposited by a CVA, especially a FCVA, process. One example described below comprises a layer of nickel and a layer of copper, both deposited by FCVA onto a polymer. This is of use in electronics applications as both are etchable. Here the seed layer promotes adhesion of the copper layer to the polymer substrate. Still further specific embodiments of the invention provide electronic components comprising substrates coated with one or more metallic layers, deposited by CVA, especially by FCVA as described herein.

Still further provided by the invention are substrates coated with a reactive coating using CVA, especially FCVA of the invention. Other optional and preferred features of the above methods and products of the invention apply to such reactive coating-coated substrates.

The invention can thus advantageously be used to coat substrates that comprise one or polymers. Substrates made of, e.g. comprising or consisting of, polymers coated with metallic coatings or alloy coatings deposited via FCVA constitute particular embodiments of the invention.

BRIEF DESCRIPTION OF THE DRAWINGS

The invention is now described in the following specific examples, with reference to the accompanying drawings, which are not to be construed as limiting the scope of the invention, in which:

FIG. 4A shows the simulated magnetic field strength as a function of the distance above the target in an apparatus comprising only filter and anode coils (i.e. not comprising the third, auxiliary coil of the invention);

FIG. 4B shows the simulated magnetic field strength as a function of the distance above the target in an apparatus of the invention (i.e. an apparatus comprising filter, anode and auxiliary coils);

FIG. 5A shows the simulated magnetic field strength as a function of the radial distance from the target centre in an apparatus comprising only filter and anode coils (i.e. not comprising the third, auxiliary coil of the invention); and FIG. 5B shows the simulated magnetic field strength as a function of the radial distance from the target centre in an apparatus of the invention (i.e. an apparatus comprising filter, anode and auxiliary coils).

FIGS. 7A to 7E show samples of aluminium alloy hard disk drive platters coated with chromium using an apparatus and method of the invention, where the arc current was set at 85V, no bias applied.

FIG. 1 shows a conventional cathode arc source (10), as described in further detail in WO 98/03988.

Figure 1:
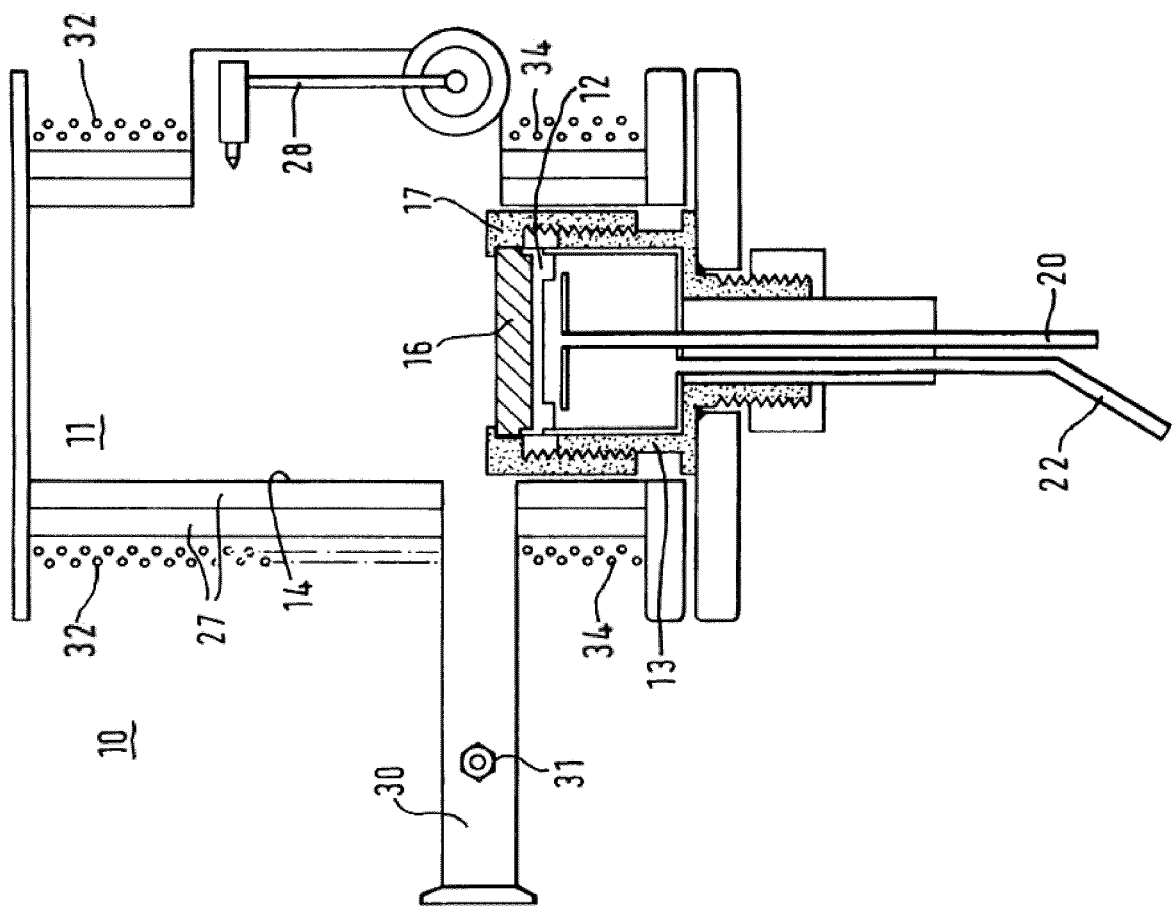
FIG. 1 shows a side, cut-away schematic view of a conventional cathode arc source.

The source (10) comprises a cathode (12) shrouded by a non-insulating shroud (13) and an anode (14) that is formed by the inside wall of the vacuum chamber (11). A target (16) is in electrical contact with the cathode (12). An insulating shroud (17) surrounds the target to prevent arcing between sides of the target (16) and the anode (14). The cathode (12) and the anode (14) are connected to an arc power supply (not shown).

Cooling of the cathode is achieved via supply of cooling water via water inlet (20) and water outlet (22). Cooling of the anode is likewise achieved by supply of cooling water via a water inlet and water outlet (not shown) of the anode cooling jacket (27).

A rotatable striker (28) is mounted on the wall of the vacuum chamber and is adapted to rotate towards and contact the target (16) to achieve ignition of the cathode arc.

A view port (30) including a swagelock fitting for gas input (31) is mounted on the side of the source for visible inspection of the arc during operation.

Above the target (16) there is a filter coil (32) which acts as a first magnetic field source and mounted above the target (16) and around the cylindrical wall of the chamber is a anode coil (34) which acts as a second magnetic field source.

Figure 2A:
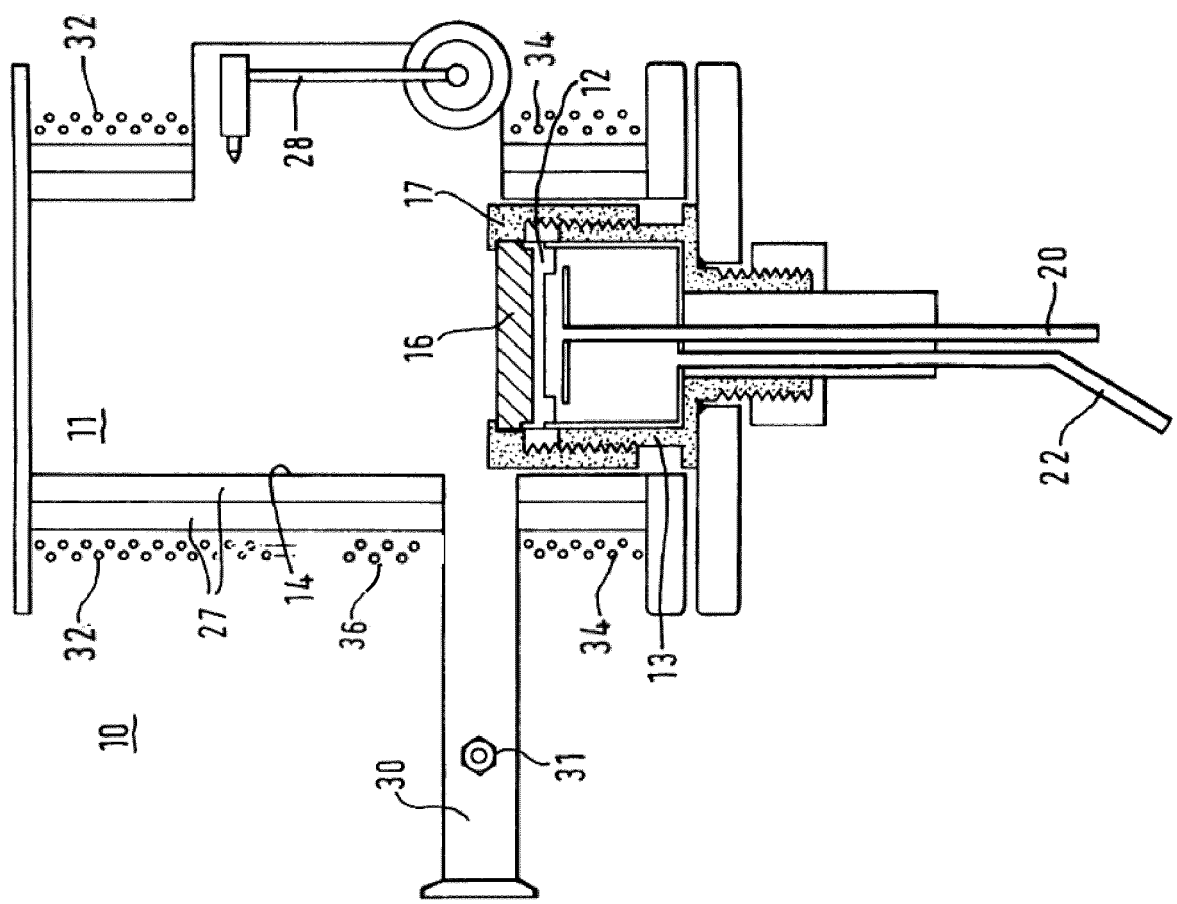
FIG. 2A shows a similar view of a cathode arc source according to a first embodiment of the invention.

FIG. 2A shows a cathode arc source according to one embodiment of the invention. The cathode arc sources comprises a cathode (12), non-insulating shroud (13), anode (14), vacuum chamber (11), target (16), insulating shroud (17), water inlet (20), water outlet (22), anode cooling jacket (27), striker (28), view port (30), gas input (31) and first and second magnetic coils (32, 34), referred to as the filter coil and the anode coil respectively, as in the conventional cathode arc source shown in FIG. 1 and as described above.

In addition, the cathode arc source shown in FIG. 2A comprises an auxiliary coil (36) which acts as a third magnetic field source and surrounds the vacuum chamber (11) at a position between the filter (32) and anode (34) coils. Due to the position of the striker (28), the auxiliary coil (36) can only be seen on the left-hand side of the cathode arc source shown in FIG. 2A.

Figure 2B:
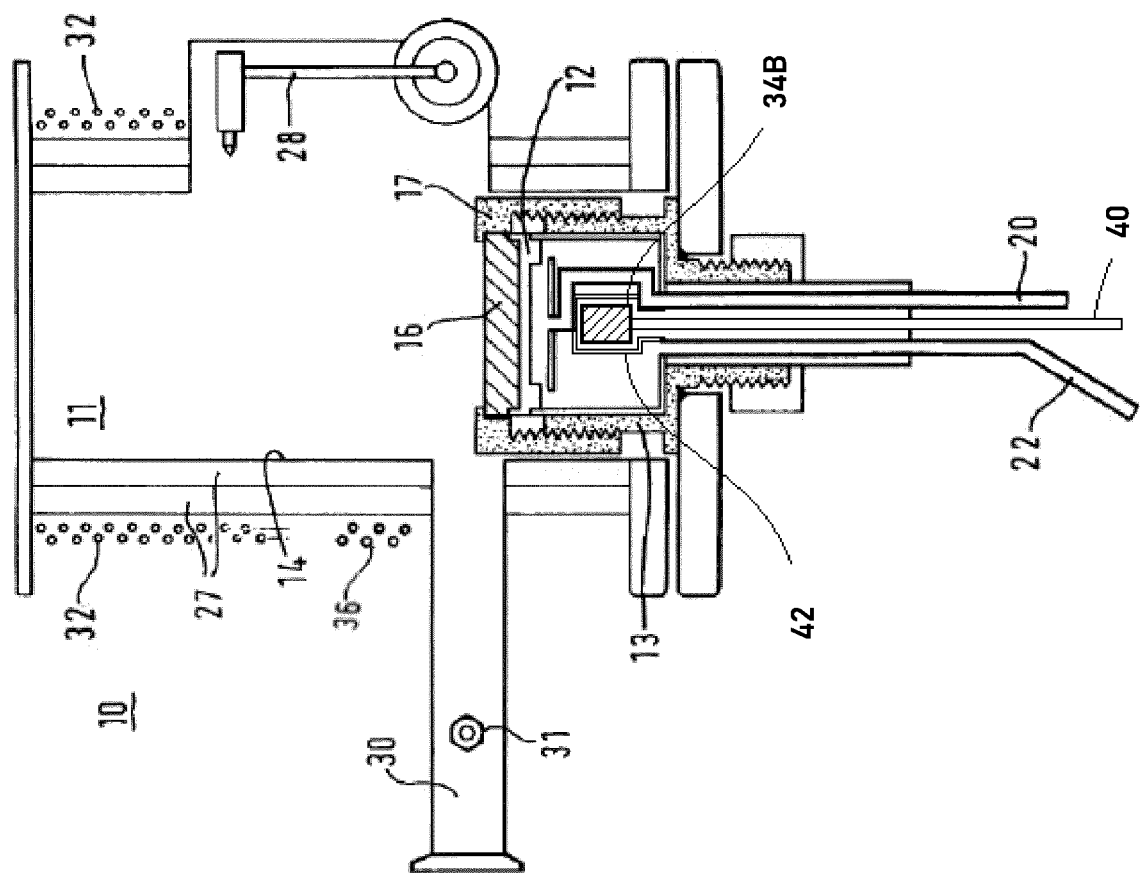
FIG. 2B shows a view of a cathode arc source according to a second embodiment of the invention.

Alternatively, the anode coil (34) can be replaced with a cylindrical permanent magnet (34B), as shown in FIG. 2B. It will be understood that in the description of the operation of the apparatus below, the anode coil (34) can be replaced with this permanent magnet (34B) without substantially affecting the working of the invention.

The magnet (34B) is has a strength of 500 mT.

Magnet (34B) is attached to rod 40 which can be used to move the magnet up and down in a direction normal to the target (16) at distances from 4 cm to 9 cm beneath the target surface. The magnet may also be surrounded by a wall (42) to segregate the magnet (34B) from the water cooling chamber (supplied by inlet (20)) to ensure that the magnet remains dry.

In operation of the cathode arc source (10) magnetic fields are generated by the respective coils (32, 34, 36) and a resultant magnetic field is produced within the vacuum chamber (11) such that, at a region above the target, the magnetic field strength is zero (or minimal) in a direction substantially normal to the target (16). The region of zero field strength, or "null region", is within the vacuum chamber (11) and a short distance above the target (16). Variation of the currents in the respective coils (32, 34) will vary the distance between the surface of the target (16) and the null point.

In use of this cathode arc source, the currents in the respective first, second and third coils (32, 34, 36) are varied such that the null region, i.e. the region at which the magnetic field in a direction substantially normal to the target has zero strength, is between 0.5 cm and about 5 cm away from the target (16).

Figure 3B:
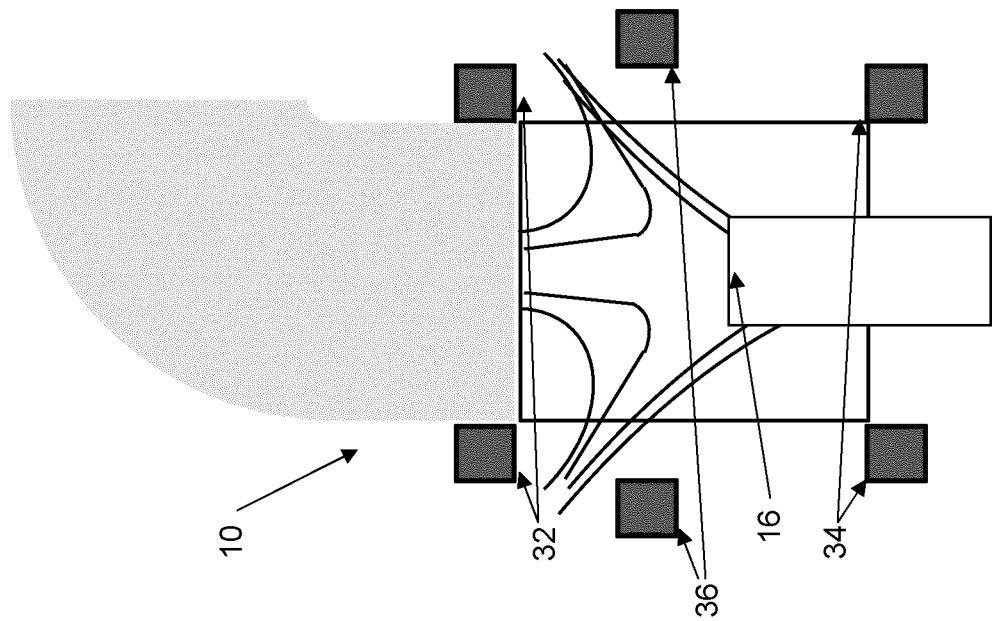
FIGS. 3A and 3B are schematic diagrams showing the resultant magnetic field lines in a conventional cathode arc source (FIG. 3A) and a cathode arc source of the invention (FIG. 3B)
Figure 3A:
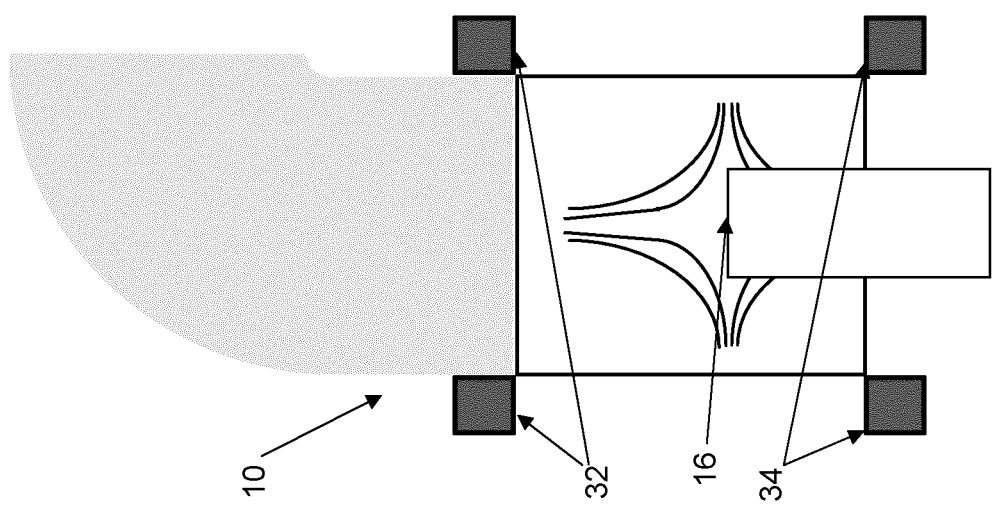

The filter (32) and anode (34) coils are of opposite polarity and hence cancel each other out in a direction normal to the target (16) such that there is an area above the target in which the resultant magnetic field in a direction normal to the target is zero. However, the magnetic fields from the filter (32) and anode (34) coils reinforce each other at positions radial to the target (16) and hence (with the auxiliary coil (36)) the magnetic field strength radial to the target (16) is large. The auxiliary coil (36) (located between the first and second coils) has an opposite polarity to the filter coil (32). The magnetic field generated by the auxiliary coil (36) reduces the radial magnetic field strength. This is shown in schematic FIGS. 3A and 3B which show the magnetic field lines of the resultant magnetic field in a conventional cathode arc source (FIG. 3A) and in a cathode arc source of the invention (FIG. 3B). The reduced radial field strength in the cathode arc source of the invention can be seen in FIG. 3B.

In addition, the auxiliary coil (36) increases the size of the area of low magnetic field strength above the target (see FIGS. 4A, 4B, 5A and 5B). FIGS. 4A, 4B, 5A and 5B are simulated magnetic field strength plots. FIGS. 4A and 5A are representative of conventional cathode arc sources (i.e. those containing only two separate magnetic field sources), whilst FIGS. 4B and 5B are representative of cathode arc sources of the invention.

For each of the pairs of plots, it can be seen that for the cathode arc sources of the invention both the region of lower field strength above the target is larger in size and the field strength at positions radial to the target (i.e. at regions between the first (32) and third (36) coils) is reduced.

Example 1—Chopping Current and Plasma Output with Varying Anode/Auxiliary Coil Currents In order to determine arc stability at lower currents, the apparatus of FIG. 2A was used and the current through the anode coil (34) and the auxiliary coil (36) were varied along with the arc current used. The filter coil (32) current was kept constant at 12 A. The target was a 99.95% pure copper target having a diameter of 9 cm.

The chopping current (i.e. the highest arc current at which chopping of the arc is observed) was measured and recorded for different coil currents for the anode and auxiliary current, and are shown in Tables 1 A and 1B below. In addition, the plasma output was measured and recorded for each combination of auxiliary and anode coil currents when the arc current was 85 A and these are shown in Tables 2 A and 2B.

TABLE 1A

| Chopping Current | | Anode Coil (A) | | | | | |
|---|---|---|---|---|---|---|---|
| (A) | | 2 | 3 | 4 | 5 | 6 | 7 |
| Auxiliary Coil (A) | 0 | 69 | 67 | 68 | 63 | 63 | 73 |
| | 1 | 68 | 64 | 67 | 69 | 74 | 82 |
| | 2 | 60 | 67 | 72 | 78 | 80 | 81 |
| | 3 | 65 | 64 | 65 | 74 | 98 | 90 |
| | 4 | 67 | 67 | 73 | 78 | 99 | 85 |
| | 5 | 64 | 73 | 72 | 85 | 82 | 82 |

TABLE 1B

| | | Anode Coil (A) | | | | |
|---|---|---|---|---|---|---|
| Chopping Current (A) | | 1.2 | 1.5 | 1.8 | 2 | 3 |
| Auxiliary Coil (A) | 0 | 68 | 71 | 73 | 73 | 77 |
| | 1 | 68 | 70 | 71 | 73 | 70 |
| | 2 | 74 | 71 | 67 | 67 | 70 |
| | 3 | 70 | 73 | 68 | 67 | 70 |
| | 4 | 70 | 70 | 75 | 77 | 70 |
| | 5 | 70 | 70 | 67 | 73 | 76 |

TABLE 2A

| | | Anode Coil (A) | | | | |
|---|---|---|---|---|---|---|
| Plasma Output (V) | | 2 | 3 | 4 | 5 | 6 | 7 |
| Auxiliary Coil (A) | 0 | 0.00 | 0.00 | 0.13 | 0.19 | 0.07 | 0.19 |
| | 1 | 0.00 | 0.10 | 0.20 | 0.20 | 0.18 | 0.18 |
| | 2 | 0.10 | 0.19 | 0.22 | 0.20 | 0.20 | 0.16 |
| | 3 | 0.29 | 0.29 | 0.15 | 0.12 | 0.12 | 0.10 |
| | 4 | 0.20 | 0.11 | 0.06 | 0.04 | 0.07 | 0.09 |
| | 5 | 0.10 | 0.05 | 0.07 | 0.08 | 0.06 | 0.09 |

TABLE 2B

| Plasma Output | | Anode Coil (A) | | | | |
|---|---|---|---|---|---|---|
| (V) | | 1.2 | 1.5 | 1.8 | 2 | 3 |
| Auxiliary Coil (A) | 0 | 0.00 | 0.00 | 0.00 | 0.00 | 0.00 |
| | 1 | 0.00 | 0.00 | 0.00 | 0.00 | 0.10 |
| | 2 | 0.00 | 0.00 | 0.10 | 0.10 | 0.20 |
| | 3 | 0.20 | 0.20 | 0.29 | 0.21 | 0.20 |
| | 4 | 0.20 | 0.20 | 0.20 | 0.11 | 0.09 |
| | 5 | 0.09 | 0.10 | 0.02 | 0.03 | 0.05 |

The inventors have thus found that using a cathode arc source having three separate magnetic field source gives an increased area above the target where the magnetic field strength is low and also reduces the strength of the magnetic field radial to the target. This means stable arcs can be produced using lower currents and thus allows for cathode arc sources to be used to deposit a wider range of metallic coatings on substrates.

Example 2—Magnetic Field Strength Simulation Studies

In addition, simulation studies were carried out to assess the effect the addition of the auxiliary coil has on the magnetic field strength at the target.

FIG. 4A shows the simulated normal magnetic field strength (T) from 0.05 m below the target to a height of 0.4 m above the target in an apparatus in which no auxiliary coil is present (comparative example). FIG. 4B shows the simulated normal magnetic field strength (T) from 0.05 m below the target to a height of 0.4 m above the target in an apparatus of the invention comprising three coils; a filter coil, an anode coil and an auxiliary coil.

It can be seen that the addition of the third, auxiliary coil results in a greater region where the normal magnetic field strength is zero (from approx. 0.05 m below the target to 0.05 m above the target in FIG. 4B, compared to approx. 0.03 m in FIG. 4A).

In addition, the radial magnetic field strength was simulated at radial distances from the centre of the target for up to 0.15 m. FIG. 5A shows the simulated radial magnetic field strength (T) in an apparatus in which no auxiliary coil is present (comparative example). FIG. 5B shows the simulated radial magnetic field strength (T) in an apparatus of the invention comprising three coils; a filter coil, an anode coil and an auxiliary coil.

In contrast to FIG. 5A, in FIG. 5B it can be seen that the radial magnetic field strength at regions from 0.05 to 0.15 m from the centre of the target is significantly reduced. This is attributed to the addition of a third, auxiliary coil which reduce the resultant radial field strength as described herein.

Example 3—Example Coatings

Figure 6:
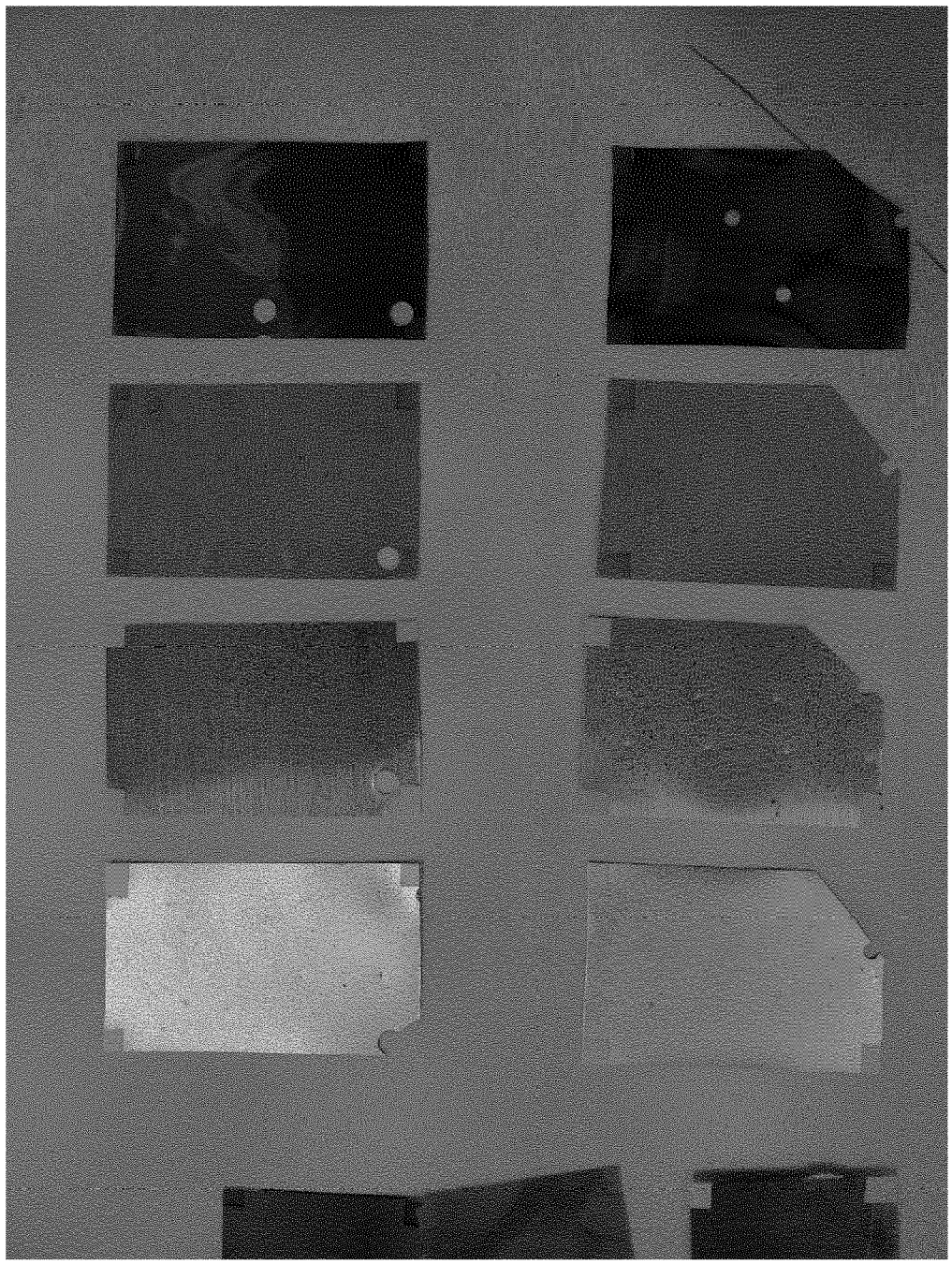
FIG. 6 shows polymer sample strips coated with copper using an apparatus and method of the invention.

Using a FCVA source of the invention and a copper target, thin films of copper (c. 200 nm) were deposited onto polymer strips. Samples are shown in FIG. 6. Conductivity of the copper films were tested; conductivity was found in all cases to be close to that of, and in some cases comparable to that of, bulk copper. Different appearance of the strips reflects underlying surface morphology prior to FCVA copper deposition.

Example 4—Coating Quality

Two sets of five aluminium alloy hard disk drive platters were coated with chromium using the three-coil apparatus of the invention using common operating parameters (anode coil current of 1.2 A, auxiliary coil current of 4 A and filter coil current of 12 A), targets and substrates, with only the arc current being changed between Set 1 and Set 2. The coated disks were then examined for surface particle content.

Figure 8:
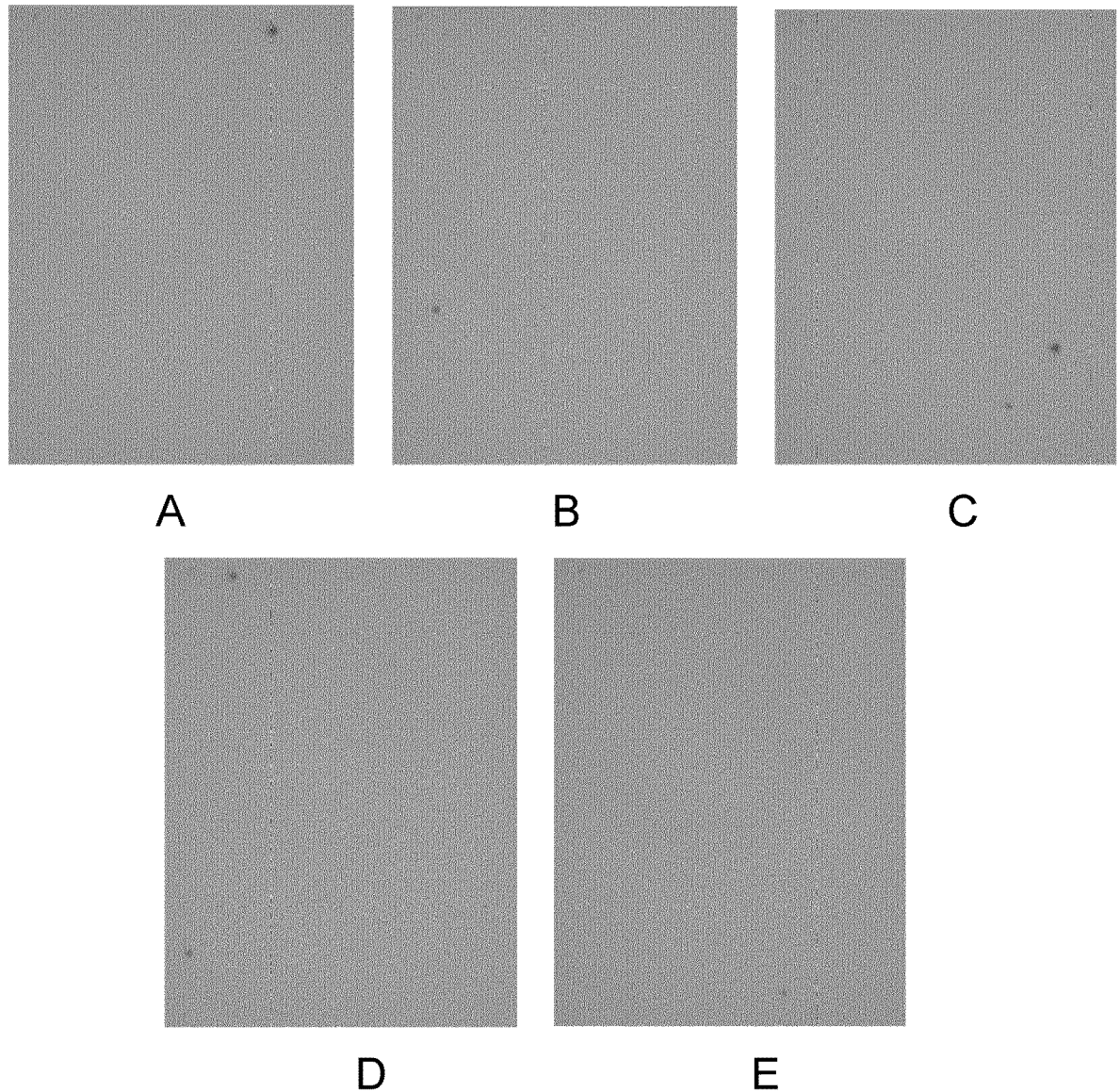
FIGS. 8A to 8E show samples of aluminium alloy hard disk drive platters coated with chromium using an apparatus and method of the invention, where the arc current was set at 160V, no bias applied.

The results are shown in FIGS. 7 and 8. FIGS. 7A to 7E show ×3000 magnification optical microscope analysis of the five disks coated using arc current of 85 A (Set 1) and FIGS. 8A to 8E show ×3000 magnification optical microscope analysis of the five disks coated using arc current of 160 A (Set 2).

These results showed there were more visible particles in the coatings made using an arc current of 160 A and the particles created in the 160 A arc current were visibly larger.

The roughness of samples of Set 1 and Set 2 were analysed at 2 positions each for $R_a$ and $R_z$ values, indicators respectively of overall roughness (neutralizing outlying points) and roughness based on highest peak to lowest valley across the coating. The results are set out in the table below:

| Arc Current | Set 1 (85A) | | Set 2 (160A) | |
| --- | --- | --- | --- | --- |
| | #1 | #2 | #1 | #2 |
| Thickness (nm) | 227 | 229 | 230 | 234 |
| $R_a$ (nm) | 3.2 | 3.6 | 3.0 | 3.0 |
| $R_z$ (nm) | 39.1 | 29.9 | 42.1 | 33.0 |

The thickness of each measured coating sample was similar. The coating made at arc current 85 A had similar $R_a$ to that made at arc current 160 A, while having generally lower $R_z$.

Example 5—Nickel Coatings

Using a FCVA source of the invention and a nickel target (surrounded by a magnetic ring mounted in the chamber and encircling the nickel target) thin films of nickel (c. 200 nm thickness) were deposited onto polymer strips. These coatings were found to be magnetic, thus exhibiting this property of bulk nickel.

Example 6—Etchable Nickel and Copper Coatings

Using a FCVA source of the invention and a nickel target (surrounded by a magnetic ring mounted in the chamber and encircling the nickel target) thin films of nickel (c. 30 nm) were deposited onto polymer strips as seed layers and then on top were deposited thin upper layers of copper (c. 200 nm), using a copper target. These coated substrates are suitable for etching into electronic components, e.g. as part of circuit boards.

The invention thus provides an improved cathode arc source, especially for use with metallic and alloy targets.

The invention claimed is:
1. A cathode arc source comprising:
a station for a cathode target;
a first magnetic field source located between the target station and the position where a substrate is to be located;
a second magnetic field source located below the target station; and
a third magnetic field source located between the first and second magnetic field sources and having an opposite polarity to the first magnetic field source;
characterised in that the resultant magnetic field from the first, second and third magnetic field sources has zero field strength in a direction substantially normal to the target station at a position of up to 10 cm above the target, and wherein the second magnetic field source has an opposite polarity to the first magnetic field source.

2. A cathode arc source according to claim 1 wherein the resultant magnetic field from the first, second and third magnetic field sources has zero field strength in a direction substantially normal to the target station at a position of up to 8 cm above the target.

3. A cathode arc source according to claim 1 wherein the first, second and/or third magnetic field sources are magnetic field generating coils.

4. A cathode arc source according to claim 1 wherein the strength of at least one of the first, second and third magnetic field sources are adjustable.

5. A cathode arc source according to claim 4 wherein the strengths of at least two of the first, second and third magnetic field sources are adjustable.

6. A cathode arc source according to claim 1 wherein the strength of the first, second and third magnetic field sources are all adjustable.

7. A cathode arc source according to claim 1 wherein the first and third magnetic field sources are magnetic field generating coils and the second magnetic field source is a permanent magnet.

8. A cathode arc source according to claim 1 wherein the distances of at least one of the first, second and third magnetic field sources either above or below the target are adjustable.

9. A cathode arc source according to claim 8 wherein the distances of at least two of the first, second and third magnetic field sources either above or below the target are adjustable.

10. A cathode arc source according to claim 1 wherein the distances of the first, second and third magnetic field sources above or below the target are all adjustable.

11. A cathode arc source according to claim 1, comprising a carbon target.

12. A cathode arc source according to claim 1, comprising a metal target or an alloy target.

13. A method of depositing a coating on a substrate, comprising generating positive ions from a target in a cathode vacuum arc source according to claim 1, and depositing the ions onto the substrate, wherein the target is a metal other than aluminum, chromium or titanium.

14. A method according to claim 13, wherein the target comprises copper or nickel.

15. A method according to claim 13, wherein the coating is deposited using a cathode arc source according to claim 1.

16. A cathode arc source according to claim 1, wherein the target has a diameter of from 5 cm to 15 cm.

17. A cathode arc source according to claim 1, wherein the resultant magnetic field is such that:
  (1) at a front surface of the target, the resultant field direction substantially normal to the front surface is towards the front surface;
  (2) magnetic field strength in the direction substantially normal to the front surface decreases with increasing distance from the target to a point or region of zero normal field strength; and
  (3) from the point or region of zero normal field strength, with increasing distance from the target, field direction is away from the front surface of the target.

\* \* \* \* \*